United States Patent [19]
Rotondaro

[11] Patent Number: 5,948,702
[45] Date of Patent: Sep. 7, 1999

[54] SELECTIVE REMOVAL OF TIXNY

[75] Inventor: Antonio L. P. Rotondaro, Plano, Tex.

[73] Assignee: Texas Instruments Incorporated, Dallas, Tex.

[21] Appl. No.: 08/966,935

[22] Filed: Nov. 10, 1997

[51] Int. Cl.[6] .................................................. H01L 21/00
[52] U.S. Cl. ........................... 438/707; 438/730; 438/738
[58] Field of Search ..................................... 438/706, 707, 438/720, 727, 730, 738, 739; 216/66, 67, 72, 74, 75

[56] References Cited

U.S. PATENT DOCUMENTS

| 5,108,542 | 4/1992 | Lin | 438/720 |
| 5,846,880 | 12/1998 | Lee | 438/738 X |
| 5,866,484 | 2/1999 | Muto | 438/738 |

FOREIGN PATENT DOCUMENTS

| 0 388 749 | 3/1990 | European Pat. Off. . |
| 0 574 075 A1 | 6/1993 | European Pat. Off. . |
| 0 661 736 A1 | 12/1994 | European Pat. Off. . |

OTHER PUBLICATIONS

Cotler, et al., "Plasma–Etch Technology", (Jul. 1990) IEEE Circuits and Devices Magazine, pp. 38–43.
Pearton, et al., "Hybrid Electron Cyclotron Resonance–RF Plasma Etching of $TiN_x$ Thin Films Grown by Low Pressure Rapid Thermal Metalorganic Chemical Vapour Deposition", Semiconductor Science and Technology (1991), pp. 830–832.

*Primary Examiner*—William Powell
*Attorney, Agent, or Firm*—Mark A. Valetti; Carlton H. Hoel; Richard L. Donaldson

[57] ABSTRACT

A dry etch method for removing $Ti_xN_y$ films by using a remote plasma to excite a oxygen+fluorine source gas mixture, generating active species that etch $Ti_xN_y$ with minimum attack to other materials. In particular, an isotropic dry etch can be used for the selective removal of TiN in W/TiN gate structures without gate oxide damage. This etch also permits selective stripping of titanium nitride in a salicidation process.

13 Claims, 2 Drawing Sheets

SELECTIVE REMOVAL OF TIXNY

BACKGROUND AND SUMMARY OF THE INVENTION

The present invention relates to integrated circuit structures and fabrication methods.

BACKGROUND

Removal of TixNy films

Titanium nitride (TixNy) is a very useful material in integrated circuit processing, and is commonly used as a diffusion barrier in contacts, vias, and trenches and in interconnect stacks. It also may serve as a "glue layer" for chemical vapor deposited (CVD) tungsten and a nucleation layer for CVD tungsten and CVD aluminum. However, the removal of TixNy films from high aspect ratio structures with minimum attack of other materials from the wafer surface has proved difficult in the past. For example, in W/TiN gates, performing a "smiling oxidation" to anneal corner damage is not easy, since the tungsten itself tends to oxidize. Hence it is necessary to undercut the TiN or to remove it without damaging the gate oxide.

Currently, wet processes are used to undercut the TiN. As these processes lack the necessary selectivity to tungsten (W), the gate structure needs to be capped with a spacer before proceeding with the undercut process. This adds complexity to the device fabrication process and reduces the process "window" (i.e. the tolerance to process variation), since the amount of undercut depends on the spacer thickness.

Poly-Free Transistor Gates

A MOSFET gate structure has been proposed (particularly for DRAMs) in which a diffusion barrier layer directly overlies the gate oxide, and a layer of metal (rather than polysilicon) overlies the diffusion barrier. For instance, an example of this structure would be a W/TiN gate structure, as described in Lee et al., "Characteristics of CMOSFET's with sputter-deposited W/TiN stack gate," 1995 Symposium on VLSI Technology Digest, p.119–20 (1995); or in Lee et al., "Gate Oxide Integrity (GOI) of MOS transistors with W/TiN stacked gate," 1996 Symposium on VLSI Technology Digest; both of which are hereby incorporated by reference.

Such advanced structures, however, pose particular difficulties in processing. One of the difficulties consists of the fact that with a normal polysilicon gate structure, there will usually be some element of "smile" to the gate corner profile. This is because when the polysilicon is exposed conventionally to a short oxidation to seal its sidewalls, some additional oxidation also occurs in the gate oxide underneath the corners of the polysilicon gate. This produces a slightly thicker gate oxide just under the corners, which in turn improves the integrity of the gate structure. (Otherwise the field enhancement at the gate corners, as well as the propensity for hot carrier damage, if any, to occur here, would tend to make the oxide under the gate corners a possible early failure area.)

TiN Etching Processes

The present inventors have discovered a method for removing TixNy films by using a remote plasma to excite a fluorinated oxygen source gas mixture, generating active species that etch TixNy with minimum attack to other materials. In particular, an isotropic dry etch is used for the selective removal of TiN in W/TiN gate structures to undercut the TiN film. The process selectivity was optimized for minimal removal of gate oxide and tungsten, thus eliminating the need for the cap spacer.

The TiN removal method of the present invention is particularly advantageous in sub-micron device processes. The advantages provided by the innovative method of the present invention include:
improved selectivity;
lower chemical consumption;
lower environmental impact;
better control of the removal process;
eliminates the need for a cap spacer to protect the W during the TiN etch;
the process endpoint can easily be controlled, leading to a much wider process window; and
the gate etch process can be integrated with the resist removal step, thus simplifying the fabrication flow.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

In the innovative method of the present invention, the species generated by the plasma discharge (such as monatomic oxygen and fluorine) are the main active components of the process, as compared to the standard current processes that use liquid chemicals to perform the TixNy removal. For the removal of TiN in W/TiN gates, an optimized isotropic dry etch can be used to replace the wet etch treatment.

Sample Embodiment: Etching W/TiN Gates

Figure 1:
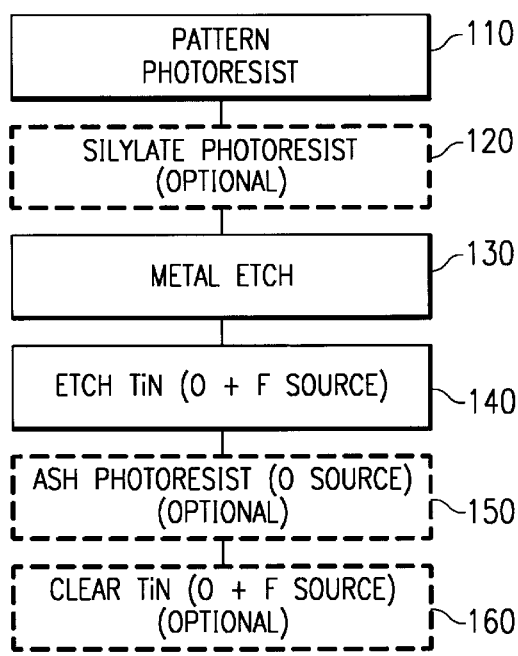
FIG. 1 shows a process flow for selectively removing TiN.

FIG. 1 shows a process flow of a preferred method for transistor gate fabrication, and FIGS. 2A–2E show successive stages in fabrication of a sample W/TiN gate structure.

Figure 2A:
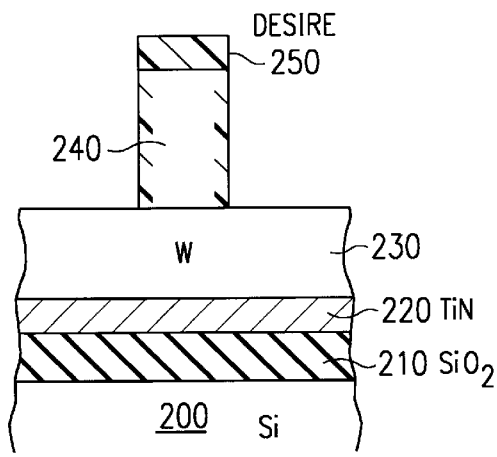
FIGS. 2A–2E show etching of a W/TiN gate structure.
Figure 2B:
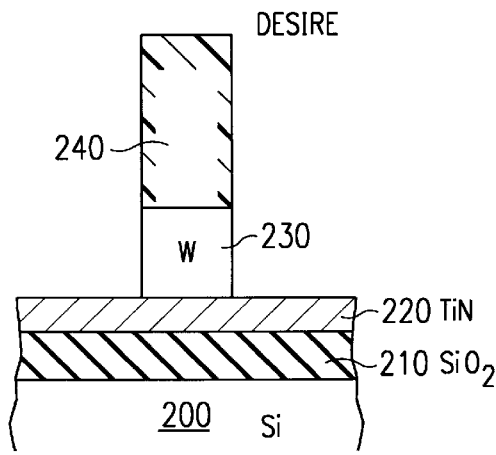

As can be seen in FIG. 2A, a gate oxide layer 210 (e.g. SiO2) is formed over a silicon substrate 200 prior to the deposition of a titanium nitride barrier layer 220.

Physical vapor deposition (PVD) and metal organic chemical vapor deposition (MOCVD) processes can be used to deposit the TiN layer. In addition, the deposition can be performed in an Applied Materials ENDURA 5500 and an Applied Materials P5000 reactor for the PVD and MOCVD processes, respectively.

Subsequently, a layer of tungsten 230 is deposited over the layer of TiN, and coated with a photoresist 240 which is then patterned (step 110).

In optional step 120, photoresist 240 is then silylated (using the "DESIRE" process) to form a hard mask layer 250. The tungsten etch (step 130) uses a conventional fluorine-based etch chemistry, and this results in the structure of FIG. 2B. Note that the overetch portion of the tungsten etch has slightly attacked the TiN layer 220, but has not eaten through it.

The cleanup process after the definition of the tungsten layer 230 has to remove the photoresist 240 and the remaining TiN 220 located between structures. In this cleanup process, the substrate temperature and the gases used are selected for high selectivity towards tungsten and SiO2. A dry process is used to strip the resist 240 and the TiN layer 220 with small TiN undercut and negligible oxide loss. No ion bombardment needs to be used, which eliminates the need for a smiling oxidation process. Furthermore, a grid can be used during the TiN removal process to protect the structure.

Figure 2C:
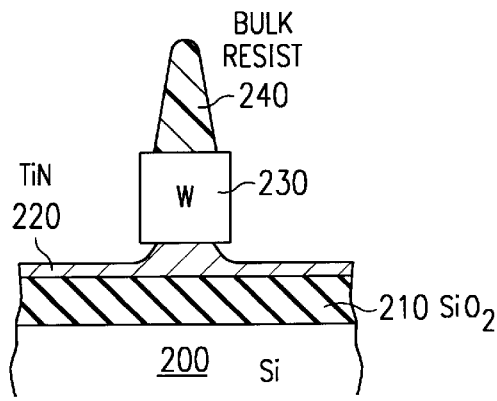

An etching step (step 140) is then performed, using a remote plasma discharge with O2 and C2F6 source gasses. This step removes the hard mask 250, exposes the bulk resist 240, and strips part or all the TiN 220 not beneath the gate, as can be seen in FIG. 2C. In order to avoid damaging the underlying thin gate oxide layer 210, which has a thickness of only about 3.0 nm in this example, the tungsten etch has to stop in the TiN layer 220.

Figure 2D:
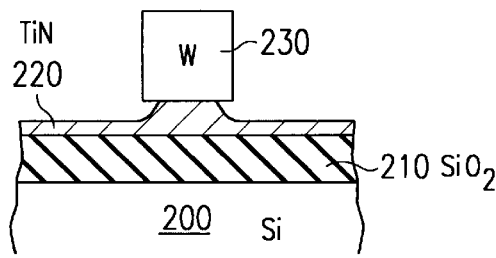
Figure 2E:
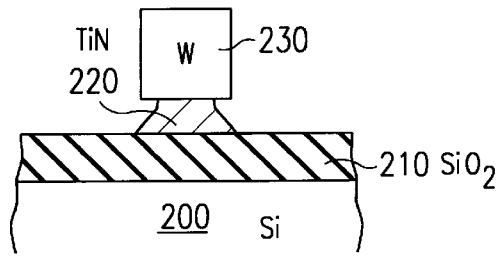

An ashing step (step 150) is subsequently performed to strip the remaining resist 240, shown in FIG. 2D. This step too uses remote plasma excitation, but the source gas is pure oxygen with no fluorine.

Finally, in optional step 160 (in the case of a thick TiN layer), another etching step with a remote plasma fed by O2/C2F6 (step 160) removes any remaining TiN residues 220. This results in the structure of FIG. 2E.

In a sample test run, the dry clean process was performed in a Mattson ASPEN II asher that uses an inductively-coupled plasma source (ICP source) to generate the active species. The test was performed on patterned structures and the inspection made by TEM. Three gate stacks were tested during this test run.

The first gate stack included the following layers from top to bottom: 30 nm Si3N4; 80 nm W; 20 nm TiN; and 3.0 nm SiO2; with Si beneath the stack. The second gate stack had the following layers: 30 nm SiO2; 80 nm W; 20 nm TiN; 3 nm SiO2; and Si. The third gate stack included: 30 nm Si3N4; 80 nm W; 10 nm TiN; 3 nm SiO2; and Si on the bottom. Following are the specific parameters used in the sample test run: O2 Flow: 3000 sccm; C2F6 Flow: 6 sccm; Pressure: 1.3 Torr; Power: 975 W; Temperature: Room temperature; TiN Etch rate: 0.64 nm/sec; W Etch rate: 0.27 nm/sec; Time: 25 sec.

Subsequently, an ashing step in pure oxygen is preferably performed to remove the remaining bulk resist. Complete removal of the 20 nm TiN layer on the 3 nm SiO2 layer was achieved without damaging the oxide. The cap layer had no effect on the process. In the case of a 20 nm layer of TiN, a residue removal step had to be used; but in the case of 10 nm layer of TiN, this removal step was not needed in order to minimize the undercut. The process time can vary from 20 to 30 seconds depending on the initial thickness of the TiN layer and the amount of overetch during the tungsten etch.

The wafer temperature has a significant effect on the selectivity. By reducing the temperature, preferably to room temperature (i.e. less than 50 degrees C), the oxide etch rate is reduced and the TiN etch rate remains the same. Selectivities higher than 20 can be achieved by reducing the temperature, which opens the possibility of replacing the wet removal of TiN by the above described dry process, as illustrated in the following data:

1) Wafer temperature: 250 C; TiN etch rate: 0.558 nm/sec; SiO2 etch rate: 0.070 nm/sec; Selectivity: 7.97.

2) Wafer temperature: Room temperature; TiN etch rate: 0.636 nm/sec; SiO2 etch rate: 0.030 nm/sec; Selectivity: 21.20.

Titanium nitride is normally etched using a chlorine-based etch. Titanium dioxide is extremely non-volatile (indeed refractory), and titanium fluoride is also normally considered non-volatile. (TiF4 sublimes at 284 degrees centigrade at an ambient pressure of one atmosphere.) Thus, it is very surprising that the titanium nitride undercut etch can be adequately performed with an oxygen/fluorine etch having a high O:F ratio, as in the presently preferred embodiment. However, this chemistry has been found to provide an adequate etch rate, and has the particular advantage of having high selectivity to titanium silicide.

Alternative Embodiment: Etching TiN Selectively Over SiO2

The present application also discloses processes for etching TiN with high selectivity towards SiO2. The following results were obtained from an actual test run etching a layer of TiN over a layer of SiO2. Wafers with 50 nm of deposited TiN on 10 nm of SiO2 were processed for various times in a Mattson ASPEN II asher. Excited species were generated in an inductive coupled plasma discharge remote from the substrates. The substrates were kept at a temperature of 250 degrees C by a heated chuck. The TiN loss was calculated from the changes in the sheet resistance of the films measured with a Prometrix-Omni Map R555/tc tool.

O2 Flow: 3000 sccm;
C2F6 Flow: 6 sccm;
Pressure: 1.3 Torr;
Power: 975 W;
Temperature: Room temperature;
TiN Etch rate: 0.64 nm/sec;
SiO2 Etch rate: 0.03 nm/sec.

Electrical characterization showed that gate oxide integrity (GOI) and capacitance/voltage curves were not changed by the TiN etch (no significant difference before and after the etch). Thus, these results show that the thin gate oxide was completely undamaged after the TiN etch.

Alternative Embodiment: Oxynitride Gate Dielectric

In this alternative embodiment the gate dielectric is not merely a grown oxide, but is a conventional silicon oxynitride gate structure.

The inventor has determined experimentally that the disclosed oxyfluoro TiN etch is also selective to silicon nitride. Thus it is expected that the use of any oxynitride gate dielectric will result in even greater selectivity of titanium nitride etch to the gate dielectric.

Alternative Embodiment: Etching TiN Selectively Over TiSi2

A similar experiment was performed to evaluate the etch rate of TiSi2 in the O2+C2F6 plasma. In this case, amorphous TiSi2 was sputter deposited on SiO2. The following data illustrates results obtained from an actual test run etching a layer of TiN over a layer of TiSi2.

O2 Flow: 3000 sccm;
C2F6 Flow: 30 sccm;
Pressure: 1.3 Torr;
Power: 975 W;
Temperature: Room temperature;
TiN Etch rate: 1.82 nm/sec;
TiSi2 Etch rate: 0.4 nm/sec.

The following data shows film loss and selectivity as a function of process time in O2+C2F6:

After 10 sec: TiN loss 4.3 nm; a-TiSi2 loss 2.4 nm; Selectivity (TiN/TiSi2): 1.8.
After 20 sec: TiN loss 10.5 nm; a-TiSi2 loss 4.1 nm; Selectivity 2.6.

After 60 sec: TiN loss 32.3 nm; a-TiSi2 loss 11.6 nm; Selectivity 2.8.

After 120 sec: TiN loss 65.9 nm (estimated); a-TiSi2 loss 23.8 nm; Selectivity 2.8.

After 180 sec: TiN loss 99.4 nm (estimated); a-TiSi2 loss 38.1 nm; Selectivity 2.6.

The results for the removal of the sputtered TiSi2 represent the worst case scenario from the selectivity perspective. Being amorphous, the sputtered TiSi2 film etches faster than the crystalline TiSi2 films formed by the reaction of Ti with Si. This can be clearly seen for the case of the etch of TiSi2 in the C54 phase.

However, a 20 second exposure to O2+C2F6 plasma, in accordance with the methods disclosed herein, removes only 0.7 nm of the TiSi2(C54) resulting in a selectivity of TiN/TiSi(C54) of 14.8. This is a significant improvement over the observed results for the sputtered TiSi2 and allows for the removal of the unreacted TixNy film from the silicon dioxide region without affecting, in a significant way, the formed TiSi2 layers.

The use of a diluted mixture of fluorinated gases excited by a plasma source provides the necessary species to selectively etch TixNy films without significant removal of TiSi2 and SiO2.

Sample Salicide Process Embodiment

Figure 3A:
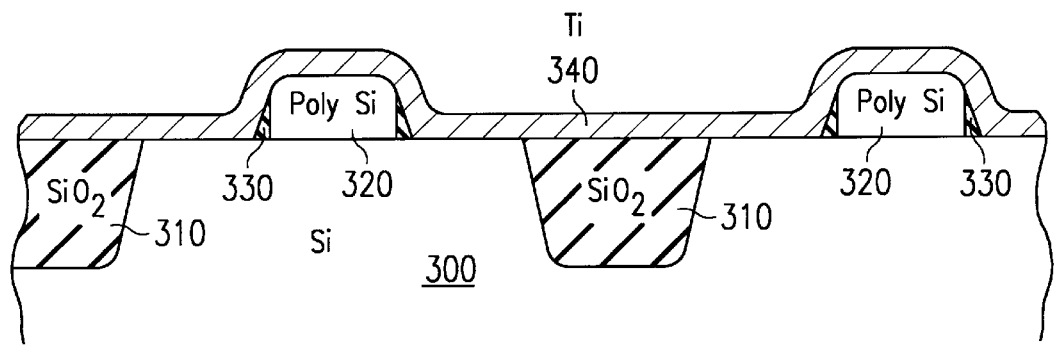
FIGS. 3A–3C show selective removal of TiN from a salicided structure.
Figure 3B:
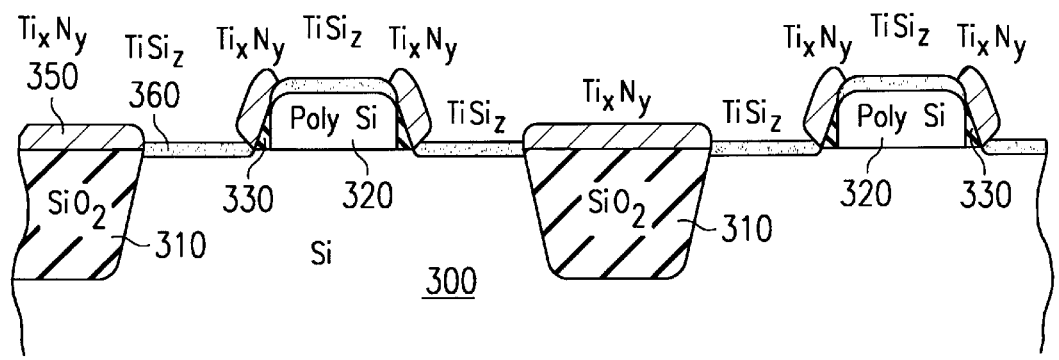
Figure 3C:
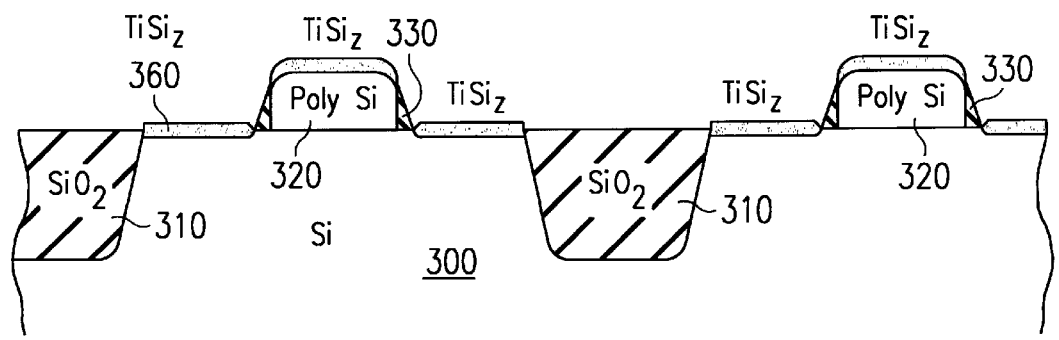

In a salicide process, as shown in FIGS. 3A–3C, a layer of titanium 340 is deposited on the wafer as a blanket film. The wafer typically includes a silicon substrate 300 which has locations of shallow trench isolation 310 (e.g. SiO2), and gate electrodes 320, consisting of polysilicon with sidewall spacers 330. Around 40 nm of titanium is then deposited, in an Applied Materials ENDURA 5500 system.

The wafers are then annealed, using an N2 ambient plasma source, to react the titanium 340 with the silicon in the gate 320, source and drain regions to form TiSi2 360, as shown in FIG. 3B. The reaction also occurs on the interconnect polysilicon lines. However, in the regions where the titanium 340 lies on silicon dioxide 310, no TiSi2 is formed, and the titanium is transformed into TixNy 350. The formation of the silicide layer can be achieved by rapid thermal processing (RTP) in the ENDURA 5500 system at around 700 degrees C for approximately 60 seconds in N2. The removal of the TixNy film 350 is a critical part of the SALICIDE process, because minimum damage to the formed TiSi2 360 is required as well as a minimum loss of SiO2 310.

By using an O2+C2F6 remote plasma etching, in accordance with one embodiment of the present invention, both requirements are fulfilled, as can be seen in FIG. 3C. Subsequently, the wafers can receive a final anneal at around 850 degrees C for approximately 30 seconds in the ENDURA 5500 system Selectivities higher than 10 are obtained for the removal of TiN towards the (C54)TiSi2 phase.

According to a disclosed class of innovative embodiments, there is provided: A method of etching a layer comprising titanium nitride, comprising the steps of: generating a vapor phase etchant by electromagnetic excitation of a source gas mixture which contains oxygen and fluorine; and exposing said layer to said vapor phase etchant; wherein said step (b.) is performed without ion bombardment of said structure.

According to another disclosed class of innovative embodiments, there is provided: A method of saliciding a partially fabricated integrated circuit structure which includes exposed silicon regions, comprising the steps of: depositing a blanket layer of a metal comprising titanium overall; annealing said structure in a nitrogen-bearing ambient to form a first compound, predominantly comprising titanium silicide, on said exposed silicon regions and a second compound predominantly comprising titanium nitride elsewhere; and removing said second compound without removing all of said first compound, by exposure to a vapor phase etchant generated by electromagnetic excitation of a source gas mixture which contains oxygen and fluorine with an atomic ratio of oxygen to fluorine which is at least 10:1; wherein said step of removing is performed without ion bombardment of said structure.

According to another disclosed class of innovative embodiments, there is provided: A method of fabricating gate structures, comprising the steps of: forming a thin gate dielectric, and forming a diffusion barrier layer comprising titanium nitride thereover; forming a patterned metallic layer which overlies said diffusion barrier layer; removing portions of said diffusion barrier layer without ion bombardment, selectively with respect to said thin gate dielectric, by exposure to a vapor phase etchant generated by electromagnetic excitation of a source gas mixture which contains oxygen and fluorine with an atomic ratio of oxygen to fluorine which is at least 10:1; whereby said diffusion barrier layer is selectively removed with minimum damage to said thin gate dielectric.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

Of course a variety of structures can be used to implement the metal layer (or layers) of the gate. In alternative embodiments, a wide variety of materials and combinations of materials can be used to implement the metal layer.

Of course, the specific etch chemistries, layer compositions, and layer thicknesses given are merely illustrative, and do not by any means delimit the scope of the claimed inventions.

What is claimed is:

1. A method of etching a layer comprising titanium nitride, comprising the steps of:
   (a.) generating a vapor phase etchant by electromagnetic excitation of a source gas mixture which contains oxygen and fluorine; and
   (b.) exposing said layer to said vapor phase etchant; wherein said step (b.) is performed without ion bombardment of said structure.

2. The method of claim 1, wherein said source gas mixture has an atomic ratio, of oxygen atoms to fluorine atoms, which is at least 10:1.

3. The method of claim 1, wherein said source gas mixture consists of a mixture of C2F6 and O2.

4. The method of claim 1, wherein said step (b.) is performed at a temperature less than 100 degrees C.

5. The method of claim 1, wherein said step (b.) uses a grid to prevent ion bombardment.

6. The method of claim 1, wherein said layer comprising titanium nitride overlies a layer of SiO2, and said step (b.) selectively removes said layer comprising titanium nitride from the surface of said SiO2.

7. The method of claim 1, wherein said step (b.) also exposes titanium silicide to said vapor phase etchant, and said layer comprising titanium nitride is removed selectively with respect to titanium silicide.

8. A method of saliciding a partially fabricated integrated circuit structure which includes exposed silicon regions, comprising the steps of:

(a.) depositing a blanket layer of a metal comprising titanium overall;

(b.) annealing said structure in a nitrogen-bearing ambient to form
a first compound, predominantly comprising titanium silicide, on said exposed silicon regions and
a second compound predominantly comprising titanium nitride elsewhere; and (c.) removing said second compound without removing all of said first compound, by exposure to a vapor phase etchant generated by electromagnetic excitation of a source gas mixture which contains oxygen and fluorine with an atomic ratio of oxygen to fluorine which is at least 10:1;

wherein said step of removing is performed without ion bombardment of said structure.

9. The method of claim 8, wherein said source gas mixture contains oxygen and fluorine with an atomic ratio of oxygen to fluorine which is at least 30:1.

10. The method of claim 8, wherein said step of removing said layer of titanium nitride is performed at a temperature less than 100 degrees C.

11. A method of fabricating gate structures, comprising the steps of:

(a.) forming a thin gate dielectric, and forming a diffusion barrier layer comprising titanium nitride thereover;

(b.) forming a patterned metallic layer which overlies said diffusion barrier layer;

(c.) removing portions of said diffusion barrier layer without ion bombardment, selectively with respect to said thin gate dielectric, by exposure to a vapor phase etchant generated by electromagnetic excitation of a source gas mixture which contains oxygen and fluorine with an atomic ratio of oxygen to fluorine which is at least 10:1;

whereby said diffusion barrier layer is selectively removed with minimum damage to said thin gate dielectric.

12. The method of claim 11, further comprising the subsequent step, after said removing step (c.), of photoresist removal by exposure to a vapor phase etchant generated by electromagnetic excitation of a source gas mixture with an atomic ratio of oxygen to fluorine which is between 1000:1 and infinity.

13. The method of claim 11, wherein said metallic layer consists of a single layer of tungsten.

* * * * *

UNITED STATES PATENT AND TRADEMARK OFFICE
CERTIFICATE OF CORRECTION

PATENT NO. : 5,948,702
DATED : Sept. 7, 1999
INVENTOR(S) : Antonio L.P. Rotondaro It is certified that error appears in the above-identified patent and that said Letters Patent is hereby corrected as shown below:

Title page, insert the following item:
--[60] Provisional Application No.: 60[033,050]
filed Dec. 19, 1996--.
Column 1, line 4, insert the following:
--Cross Reference To Relatea Application
Reference is made to and prority claimed
from U.S. provisional Application
Ser. No. 60/033,505, filed Dec. 19, 1996--.

Signed and Sealed this

First Day of August, 2000

Attest:

Q. TODD DICKINSON

*Attesting Officer*     *Director of Patents and Trademarks*